United States Patent [19]

Fisher, Jr.

[11] Patent Number: 4,701,096
[45] Date of Patent: Oct. 20, 1987

[54] WAFER HANDLING STATION

[75] Inventor: Daniel J. Fisher, Jr., Chelmsford, Mass.

[73] Assignee: BTU Engineering Corporation, North Billerica, Mass.

[21] Appl. No.: 836,294

[22] Filed: Mar. 5, 1986

[51] Int. Cl.[4] .................. B65G 1/06; B65G 17/32
[52] U.S. Cl. ........................ 414/416; 29/759; 198/346.1; 414/331; 414/404
[58] Field of Search .............. 414/217, 222, 223, 225, 414/226, 331, 403, 404, 416, 419; 198/346.1, 346.2, 465.1, 465.3; 29/740, 759

[56] References Cited

U.S. PATENT DOCUMENTS

| | | | |
|---|---|---|---|
| 3,902,615 | 9/1975 | Levy et al. | 414/416 X |
| 4,014,428 | 3/1977 | Ossbahr | 198/465.3 X |
| 4,336,438 | 6/1982 | Uehara et al. | 414/222 X |
| 4,500,407 | 2/1985 | Boys et al. | 414/416 X |
| 4,534,695 | 8/1985 | Stump et al. | 414/225 X |
| 4,558,984 | 12/1985 | Garrett | 414/217 X |
| 4,568,234 | 2/1986 | Lee et al. | 414/404 |
| 4,603,897 | 8/1986 | Foulke et al. | 414/416 X |
| 4,615,430 | 10/1986 | Satoh | 198/465.1 |
| 4,621,967 | 11/1986 | Masada | 414/225 |

Primary Examiner—Robert J. Spar
Assistant Examiner—David A. Bucci

[57] ABSTRACT

The disclosed wafer handling system includes an input port, an input queue, and output port, and an output queue. The input and output queue each include a vertical elevator assembly capable of storing plural carriers representing multiple tube-loads of wafers input in the input port and into the output queue. A ferriswheel having multiple tube-load storage means is cooperative with an input waling beam and the input queue for arraying the plural carriers therein in multiple tube-loads of wafers each at different intermediate storage locations. A vertical transfer sub-assembly is cooperative with the ferriswheel and with a computer-controlled robot arm for transferring the wafers from each tube-load of carries to quartzware maintained by an inclinable transfer pad defining an elevator-transport access port. An output walking beam is cooperative with the vertical transfer mechanism and the robot for placing processed wafers back in their original tube-load of carriers and for delivering them to the multiple tube-load output queue. The inclinable transfer pad includes movable surfaces for preventing surface contact induced product cross-contamination. Air flow patterns are so produced that positive and negative pressures cooperate to reduce air-borne contamination.

21 Claims, 14 Drawing Figures

WAFER HANDLING STATION

FIELD OF THE INVENTION

This invention is directed to the field of semiconductor wafer processing, and more particularly, to a novel wafer handling station.

BACKGROUND OF THE INVENTION

Various thin-films and other structures are formed on the surfaces of semiconductor wafers during the several phases of the integrated circuit fabrication processes. In a typical case, the wafers to be processed are disposed into so-called boats, and the wafer-loaded boats are placed on a so-called boat loading mechanism operable to transfer the tube-load of wafer-loaded boats into the thermal reaction chamber of a processing furnace tube. One or more reactants in gas phase, controllably released in the thermal reaction chamber, pyrolically decompose and are surface catalyzed by the wafers to form the intended thin-film structures thereon. The boat loading mechanism is operative after selected thin-film formation to remove the tube-load of wafer-loaded boats from the thermal reaction chamber, and the same or another process is repeated on the same or another tube-load of wafer loaded boats.

Typically, several processing furnace tubes are arrayed in a vertically stacked relation, and each is provided with a separate boat-loading mechanism. The plural processing furnace tubes are operable in parallel so that the system throughput is limited theoretically only by the number of processing furnace tubes.

To realize the theoretically achievable throughout in a practicable automated furnace system, several objectives become important. Not only must several tube-loads of wafers be available at a given time, but also they should be made available in such a way that operator assistance is minimized and operator intervention is as infrequent as possible. After wafer processing, several tube-loads of coated wafers must be received and expeditiously stored until an operator or some mechanism provided therefor removes them from the system. Further, the several tube-loads of wafers must be maintained in a very clean state, so that they are not contaminated either by air-borne contaminates during transfer or by cross-contamination from a prior tube-load of already processed wafers.

SUMMARY OF THE INVENTION

The wafer transfer station of the present invention is able to accept and deliver multiple tube-loads of wafers for processing, to receive multiple-tube loads of wafers after processing, and to store both multiple tube-loads of carriers while their associated wafers are being processed and to store multiple tube-loads of wafer-loaded carriers awaiting processing. An operator or some mechanism need only input and remove the individual wafer loaded carriers from the wafer handling station. Contamination is controlled by an air-flow system and modular construction, and cross-contamination is prevented by the provision of separately dedicated input and outgoing product surfaces and of separate dedicated wafer manipulation tools.

The wafer handling station of the present invention includes an input port and an output port. Carriers loaded with wafers to be processed are input in the input port and the same carriers after processing are output at the output port. The station of the instant invention includes input storing means for storing plural carriers input into the input port in a multiple tube-load input queue, and includes output storing means for storing the plural carriers ready to be output into the output port in a multiple tube-load output queue. The wafer handling station further includes arraying and intermiate storage means coupled to the input storing means for arraying the carriers in the input queue into plural, spacially separated arrays of carriers each defining either a different tube-load of wafers to be processed or the empty carriers of multiple tube-loads of wafers being processed in a correspondingly different storage location. Transfer means coupled between the arraying and intermediate storage means and an inclinable transfer pad assembly defining an elevator-transport access port are disclosed for transferring the wafers from any selected one of the arrays of carriers defining a tube-load of wafers in the array and intermediate storage means to the elevator-transport access port, for transferring coated wafers from the elevator-transport access port back into the corresponding one of the arrays of carriers defining the same tube-load after processing, and for transferring the individual arrays of carriers with the coated wafers to the output storing means. Means are dislcosed that are cooperative with the inclinable transfer pad assembly for presenting different surfaces to outgoing and returning tube-loads of product so that the possibility of any cross-contamination therebetween is substantially eliminated at the elevator-transport access port. A robot is incorporated in the transfer means that is operable with different pick-up fingers respectively dedicated to outgoing and returning tube-loads of product to further prevent the possibility of cross-contamination. The transfer means includes independently actuatable portions that are selectively operable in a test mode to allow operator access to the wafers of a single carrier to provide data from which further process decisions can be made. An airflow sub-system operative to induce selected pressure differentials is provided for controlling and preventing air-borne particulate contamination.

BRIEF DESCRIPTION OF THE DRAWINGS

These and other features, objects, and advantages of the present invention will become apparent as the invention becomes better understood by referring to the following solely exemplary and non-limiting detailed description of a preferred embodiment thereof, and to the drawings, wherein.

DETAILED DESCRIPTION OF THE PREFERRED EMBODIMENT

Figure 1:
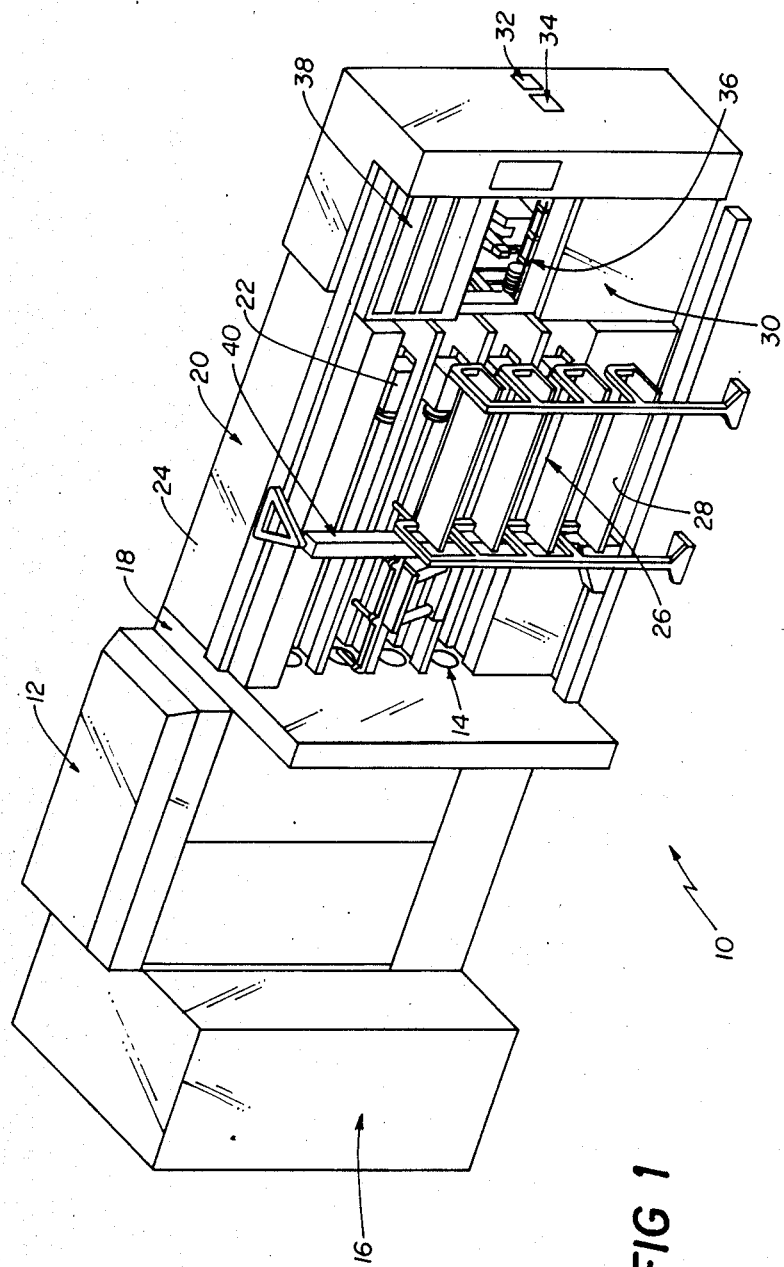
FIG. 1 is a perspective view illustrating an exemplary automated furnace system having the wafer handling station according to the present invention.

Referring now to FIG. 1, generally designated at 10 is a perspective view illustrating an exemplary automated furnace system having the wafer handling station according to the present invention. A furnace generally designated 12 has a plurality, preferably four, of elongated and horizontally extending processing furnace tubes generally designated 14 that are arrayed in a vertical stack. An input gas manifold generally designated 16 is mounted to the rear of the furnace 12 for injecting reactant in gas phase into the several processing tubes 14, and a scavenger manifold generally designated 18 is mounted to the front of the furnace 12 for establishing an intended atmospheric condition along regions of the processing tubes 14 defined adjacent their mouths. The temperature of, and the type and quantity of the reactants in gas phase injected into corresponding ones of the processing tubes 14, are determined by the particular process being run on a batch of semiconductor wafers as will be readily appreciated by those skilled inthe art.

A loading island generally designated 20 is mounted to the front of the furnace 12. The loading island has plural boat loading mechanisms 22, preferably four, one for each of the processing tubes 14. The boat loading mechanisms 22 are axially aligned with the corresponding axes of the processing tubes 14 and preferably include a cantilevered paddle, not shown, for loading and unloading individual tube-loads of wafers into and out of the corresponding processing tube. Other boat-loading mechanisms such as wheel barrows and the like can readily be employed without departing from the inventive concept. The loading island 20 preferably includes an air control system 24 to help prevent particulate and other contamination of the tube-loads of wafers positioned on the several boat loading mechanisms 22. The air control system may be, for example, a vertical or a horizontal laminar flow hood respectively for directing a vertical or a horizontal cleansing stream past each of the boat loaders 22, and may be, as another example, a nitrogen/air purge.

A transfer station generally designated 26 is provided confronting and in laterally spaced relation with the loading island 20. The transfer station 26 includes a plurality of longitudinally extending and vertically stacked cantilevered shelves 28, corresponding in number to the number of processing furnace tubes, that severally define a transfer and queuing location for receiving tube-loads of wafers that are individually dedicated to a corresponding one of the processing furnace tubes.

A wafer handling station that is the subject of the instant disclosure and generally designated 30 to be described is mounted in front of the loading island 24. As appears more fully below, the wafer handling station 30 includes an input port generally designated 32, an output port generally designated 34, an elevator-transport access port generally designated 36, and a plurality of quartzware queuing shelves generally designated 38 superadjacent the elevator port 36. A mechanical queuing station, not shown, could as well be used.

An X, Z, and Y movable elevator generally designated 40 is mounted in laterally-spaced relation to the longitudinal axis of the processing furnace tubes 14 for translation horizontally along an X axis defined between the furnace 12 and the wafer handling station 30, for translation along a Z axis defined vertically between the lowest and highest shelf locations of the transfer station 26 and the transfer and the queuing station 38, respectively, and for motion along a Y-axis defined orthogonally to the X and Z axes for transporting individual tube-loads of wafers between the boat loading mechanisms 22, the shelves 28 of the transfer station 26, the elevator-transport access port 36, and the quartzware queuing shelves 38. While any suitable elevator mechanism may be employed, it is preferred that it be the one disclosed in co-pending United States Utility patent application Ser. No. 734,919, entitled BOAT TRANSFER AND QUEUING FURNACE AND METHOD, of the same inventive entity and assignee as herein.

In the operation of the system 10, an operator individually inserts a plurality of carriers having wafers to be processed into the input port 32. The wafer handling station 30 is operative to array the inserted carriers into plural tube-loads of wafers to be processed, and maintains the several tube-loads in separate locations. The wafer handling station is then operative to transfer the wafers of any selected tube-load of wafer-loaded carriers into quartzware previously located at the elevator-transport access port for elevator pick-up. The elevator removes the quartzware having each tube-load of wafers either to the transfer shelves 28 or to the boat loaders 22. While one batch of wafers is being processed in the corresponding processing furnace tube, the wafer transfer station 30 is operative to make available another tube-load of wafers for processing at the elevator-transport access port, or to transfer a batch of coated wafers delivered by the elevator to the elevator-transport access port back into their original carriers and in their original order. The tube-loads of processed wafers may then be either temporarily stored by the wafer transfer station or the operator may remove them through the output port. The quartzware in which the wafers of each tube-load of wafers are loaded from their associated carriers is queued on the shelves of the queuing area 38. Any suitable quartzware, such as the carriers described hereinbelow, can be employed.

Figure 2:
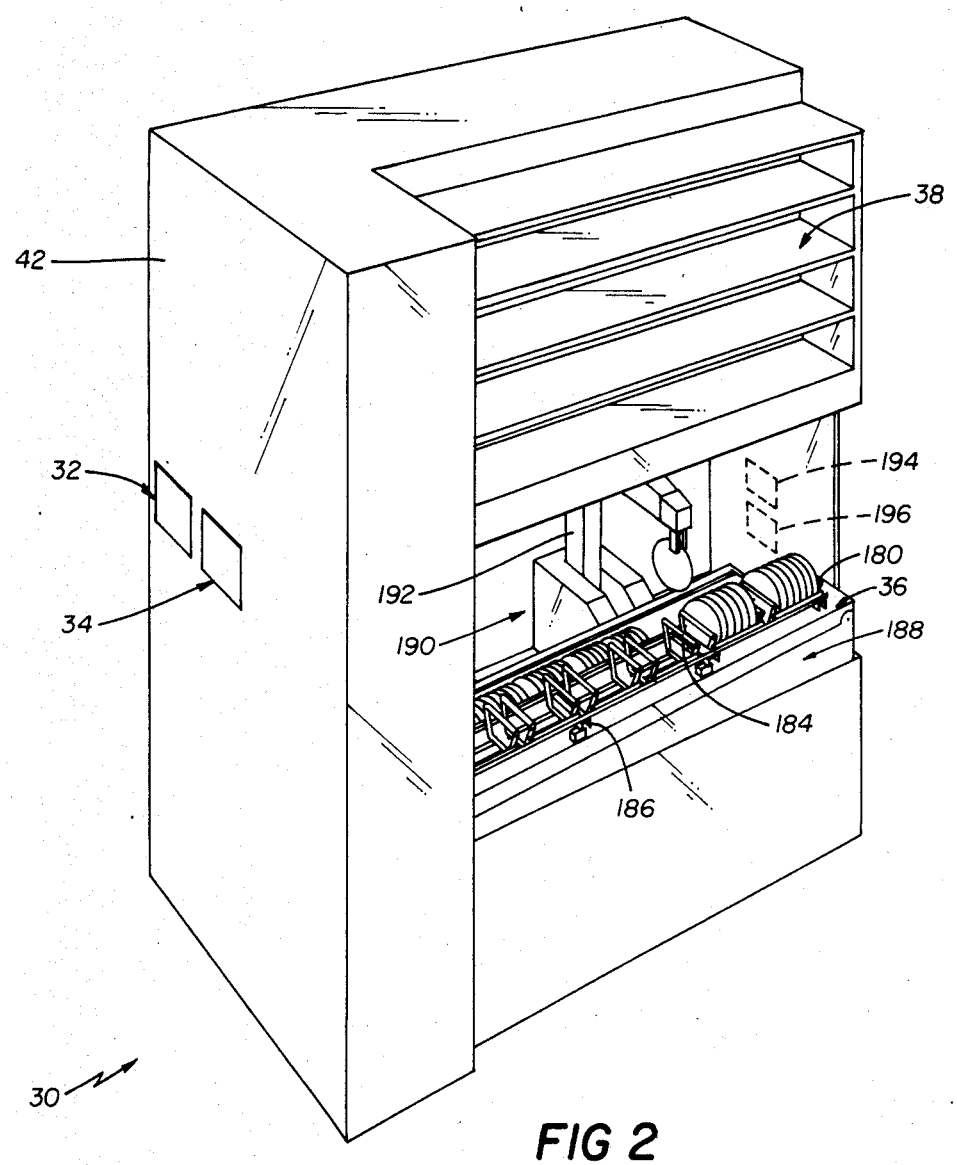
FIG. 2 is a perspective view of the wafer handling station of the present invention.
Figure 3:
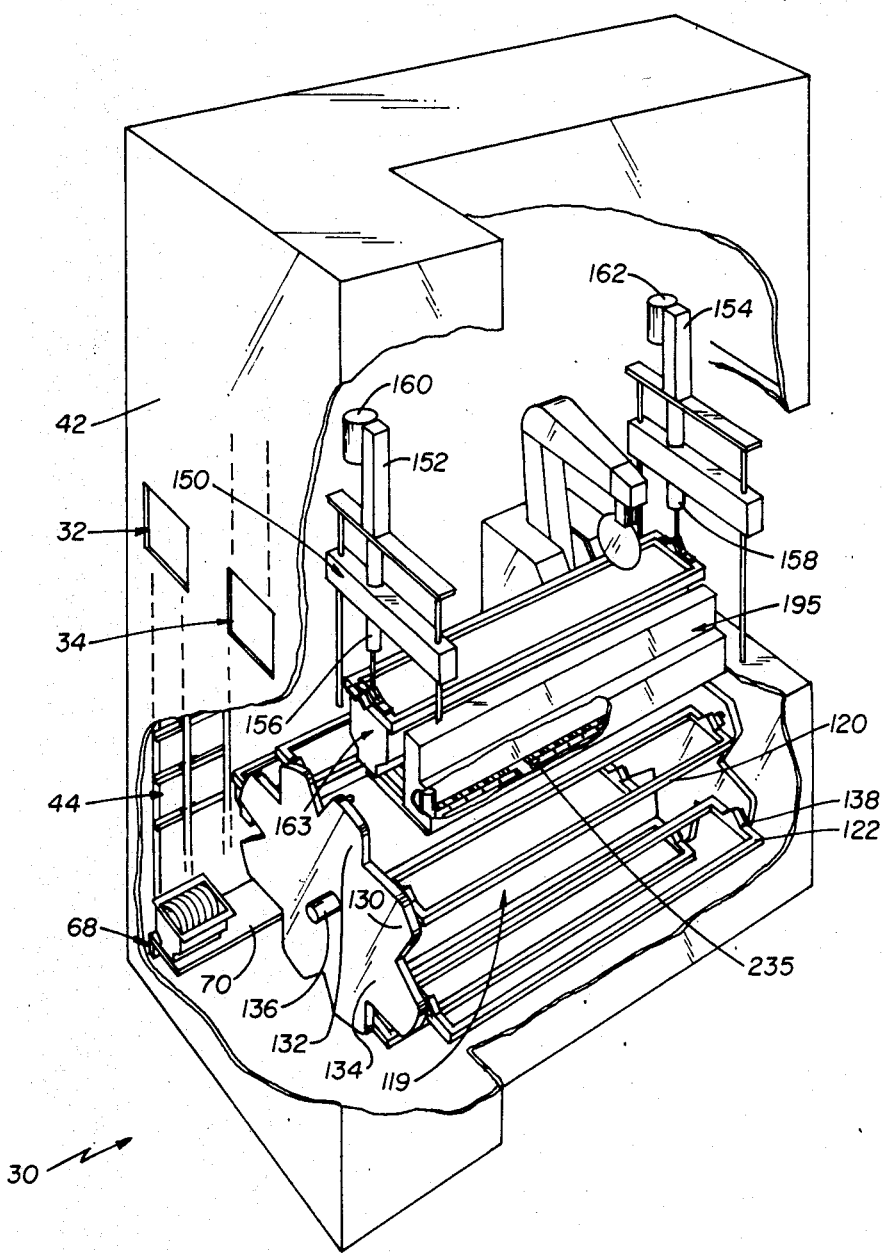
FIG. 3 is a broken-away perspective view of the wafer handling station of the present invention.

Referring now to FIGS. 2 and 3, the wafer handling station 30 includes a housing member 42 in which all the operative sub-assemblies to be described are disposed. The housing 42 is preferably fabricated of a stainless steel skeleton, not shown, which supports the various sub-assemblies, and is finished preferably by electropolished stainless steel sheets suitable for clean-room usage. The input port 32 and the output port 34 are preferably disposed through a sidewall of the housing 42 intermediate the top and bottom of the housing. The dimensions of the housing are selected such that the region below the input port 32 is sufficiently large to accommodate plural carriers input into the input port while the area defined above the output port 34 is sufficiently large to accommodate plural carriers output to the output port after processing.

Figure 4:
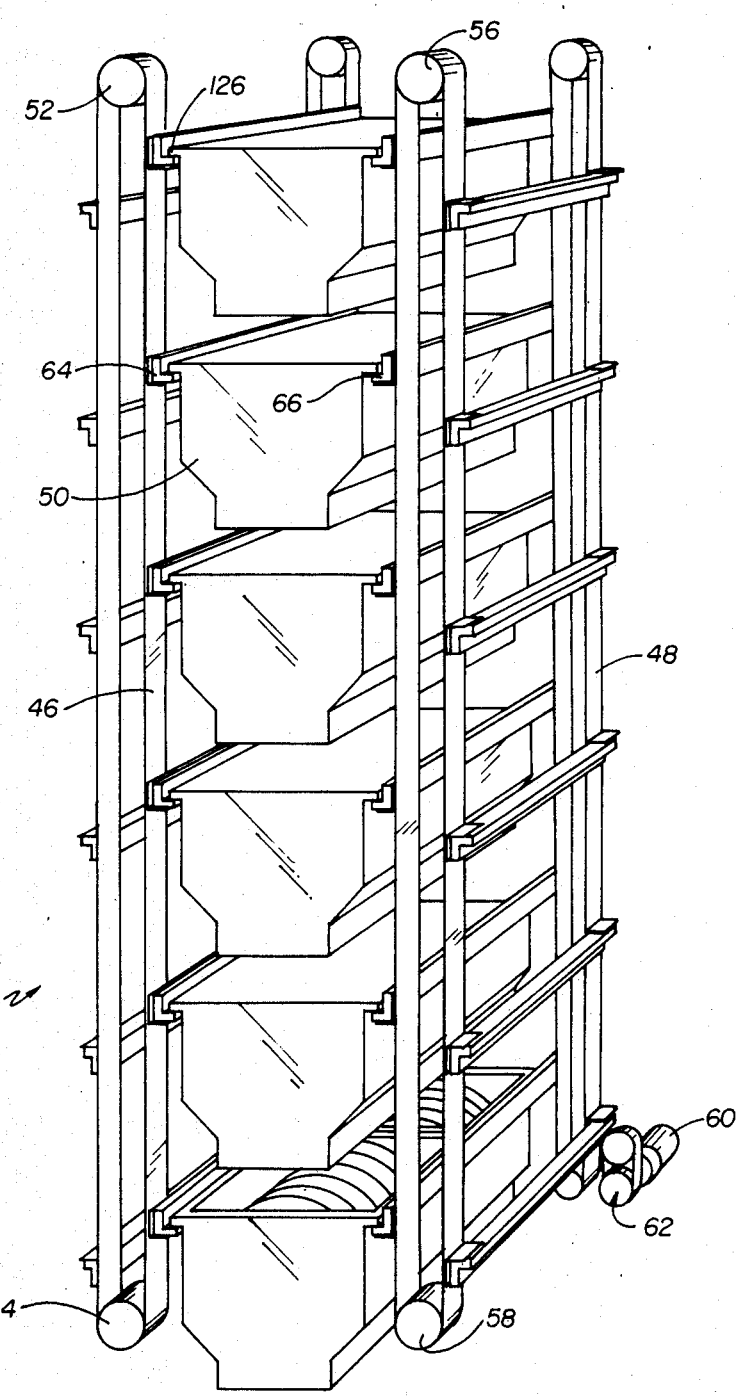
FIG. 4 is a perspective view illustrating an elevator sub-assembly of the wafer handling station according to the present invention.

Referring now to FIGS. 2, 3, and 4, and elevator sub-assembly generally designated 44 in FIG. 4 is internally mounted in the housing 42 in the region defined below the input port 32, and a similar sub-assembly is internally mounted in the housing 42 in the region defined above the output port 34. Each of the input and output elevators include a pair of vertically oriented continuous belts 46, 48 that are spaced apart by a distance selected to accommodate the width dimension of the plural carriers 50 that are severally inserted in, and received from, the input and the output ports 32, 34 respectively. The belts 46, 48 are mounted for circulating motion respectively on upper and lower shafts 52, 54 and 56, 58. The lower shafts 54, 58 are coupled to an elevator drive stepping motor 60 via a belted wheel arrangement generally designated 62. Confronting pairs of elongated angle brackets 64, 66 are fastened to the belts 46, 48 in spaced-apart relation along the direction of motion of the belts, with each of the pairs of confronting brackets 64, 66 defining a vertically movable shelf therebetween into which the carriers 50 are slidably inserted. In the preferred embodiment, the dimension of the belts perpendicular to their direction of motion is selected to accommodate two (2) carriers horizontally, and the dimension of the belts along their direction of motion is selected to accommodate six (6) carriers vertically.

Carriers having wafers to be processed are horizontally loaded in pairs into the input port 32, and are received and positively supported in the associated angle brackets 64, 66. The drive motor 60 rotates the drive shaft 58 such that the just inserted carrier pairs are moved down incrementally towards the bottom of the wafer transfer station. Nominally two tube-loads of input carriers can in this manner be temporarily stored in the input queue. Similarly, carriers having already processed wafers therein that are moved into the output port 34 in pairs in a manner to be described are moved by the output elevator upwardly into the output queue defined by the region above the output port 34. As will readily be appreciated, the input and output elevators are thereby able to maintain in the input and output queues up to twelve (12) wafer-loaded carriers at any given time, which represent nominally two (2) tube-loads of wafers to be processed and two (2) tube-loads of processed product.

Figure 5:
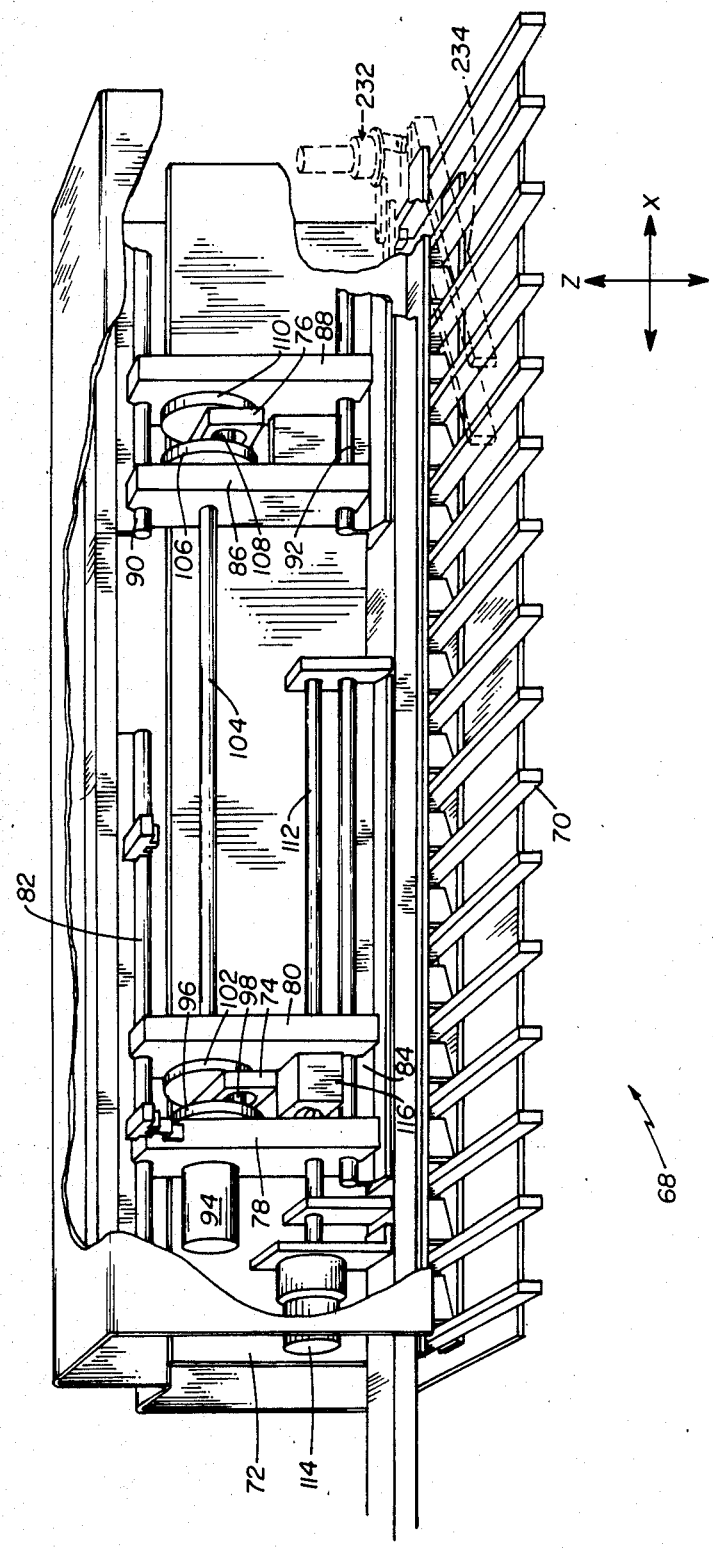
FIG. 5 is a perspective view illustrating a horizontal transfer sub-assembly of the wafer handling station of the present invention.
Figure 6:
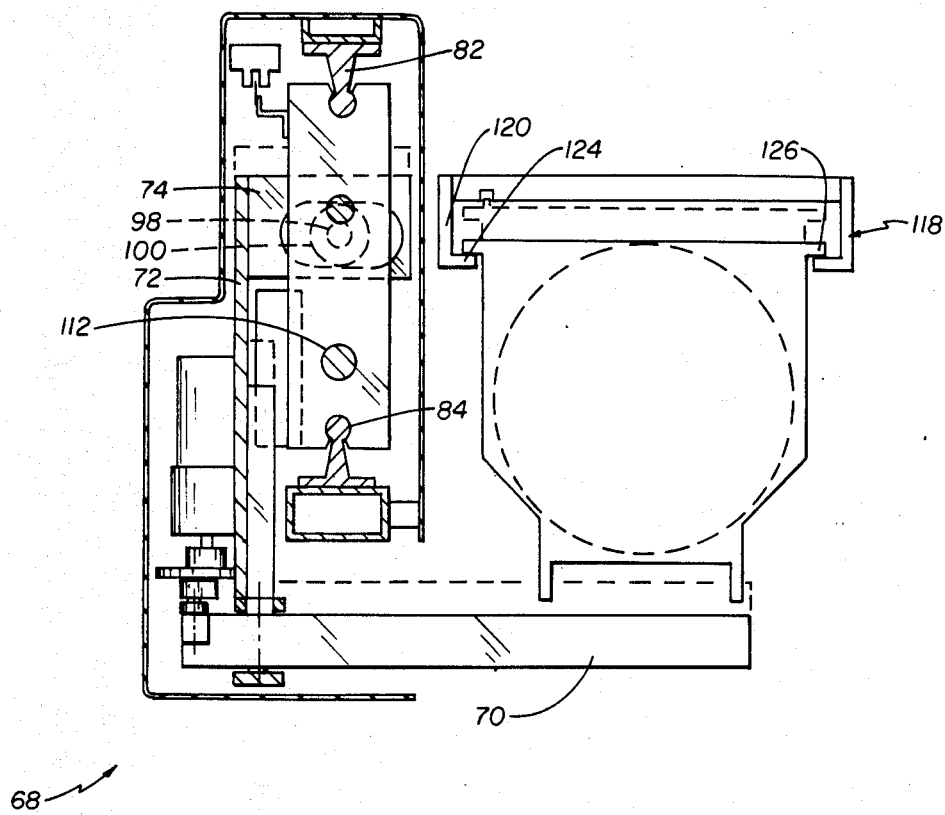
FIG. 6 is a partially pictorial sectional view illustrating the horizontal transfer sub-assembly with a wafer-loaded carrier thereon of the wafer handling station of the present invention.

Referring now to FIGS. 3, 5, and 6, a horizontal transfer sub-assembly generally designated 68 in communication with the input elevator is provided for moving the carriers in the lowest location of the input queue. The horizontal transfer sub-assembly 68 preferably is constituted as an input walking beam operative to rectilinearly move the carriers pairwise, although other suitable transfer mechanisms can be employed without departing from the inventive concept. The input walking beam includes a walking, carrier-receiving platform 70 that extends substantially from side-to-side of the wafer handling station and at the bottom thereof. The illustrated platform 70 is in the form of carrier supporting plural fingers, but any suitable geometry such as a plate can also be employed. An elongated upstanding plate 72 is fastened to the walking platform 70 along one of its lateral edges. First and second slotted members 74, 76 are fastened in spaced-apart relation to and projecting from the plate 72 on the side thereof confronting the walking platform 70.

A pair of spaced support plates 78, 80 are slidably mounted on upper and lower linear bearings 82, 84 one to either side of the slotted member 74, and a pair of spaced support plates 86, 88 are slidably mounted on upper and lower linear bearings 90, 92 one to either side of the slotted member 76. A Z motor 94 is mounted to the support 78 the shaft of which is journaled therethrough. A disk 96 is mounted for rotation with the shaft of the Z motor 94. The disk 96 has an eccentric post 98 mounted thereto having a roller bearing 100 that extends through the slot of the slotted member 74 and is eccentrically mounted to a disk 102 mounted for rotation with a shaft 104 journaled in the members 80, 86. A disk 106 is mounted for rotation with the shaft 104 and has an eccentric roller post 108 extending through the slot of the slotted member 76 and fastened to a disk 110 mounted for rotation in the support 88.

A X drive shaft 112 is journaled through the supports 78, 80 and is mounted for rotation with the shaft of a X drive motor 114. A rotary motion to linear motion convertor 116 fastened to the member 80 is operatively coupled to the shaft 112. The convertor 116 preferably is a so-called ROHLIX drive assembly.

The Z-motor 94 controls the platform 70 for controlled motion along the Z axis, and the X motor 114 controls the motion of the platform 70 along the X direction. As the shaft of the motor 94 is controllably rotated, the disks 96, 102 and the disks 106, 110 rotate between the upstanding spaced plates 78, 80 and the plates 86, 88. The posts 98, 108 gang the confronting walls of the slotted members 74, 76 moving the members either upwardly along the Z direction or downwardly in the reverse direction along the Z axis. The elongated plate 72 is thereby displaced vertically, and therewith the platform 70 moves either upwardly or downwardly in dependence on the sense of rotation of the Z motor 94. With controlled rotation of the X-motor 114, the drive 116 converts the rotary motion of the shaft 112 into linear motion along the X direction. The supports 78, 80 and the supports 86, 88 therewith move along the X-direction on the linear bearings 82, 84 and on the bearings 90, 92 in a direction determined by the sense of rotation of the X-drive motor 114.

The elevator 44 (FIG. 4) successively delivers the lowermost pairs of the carriers in the input queue to the walking beam carrier receiving platform 70 of the input walking beam 68. The walking beam 68 is then repetitively operative to lift the platform 70 in Z, to step the platform in X, to move the platform in the negative Z direction, and then to move the platform in the negative X direction back to its "home" position. The walking beam cycles four-times in the preferred embodiment, so that six (6) carriers are longitudinally aligned in a row defining a tube-load of wafers to be processed. The 4th cycle is needed to correctly position the carriers in the ferriswheel.

Figure 7:
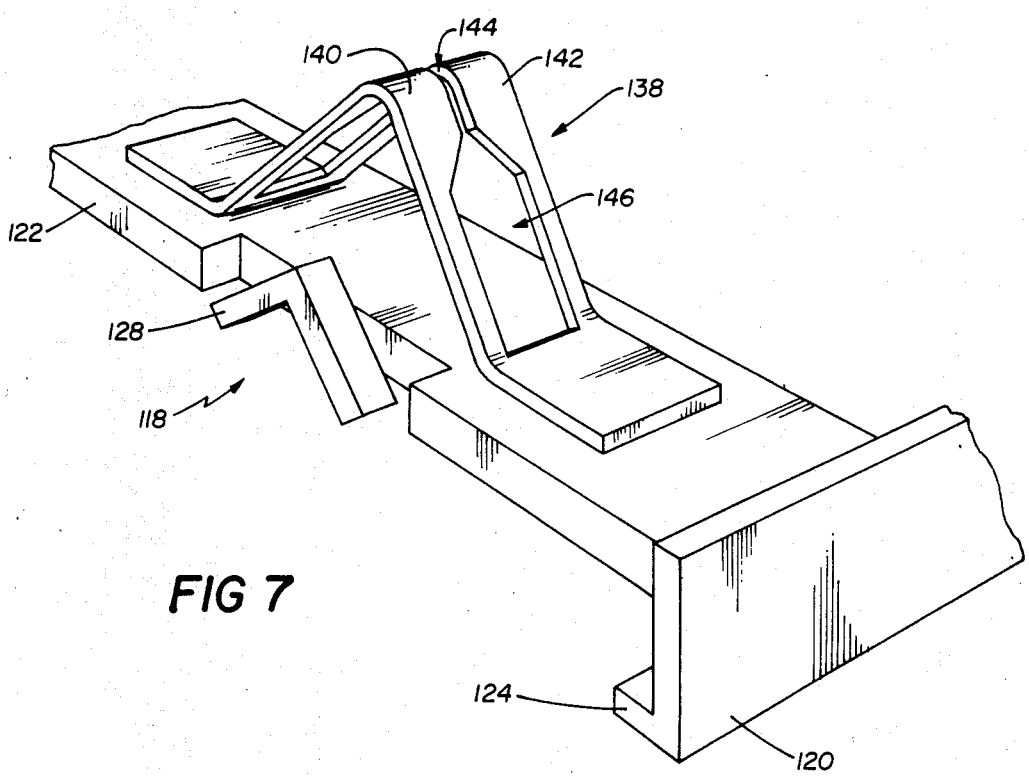
FIG. 7 is a perspective view illustrating a bracket member of the wafer handling station of the present invention.
Figure 8:
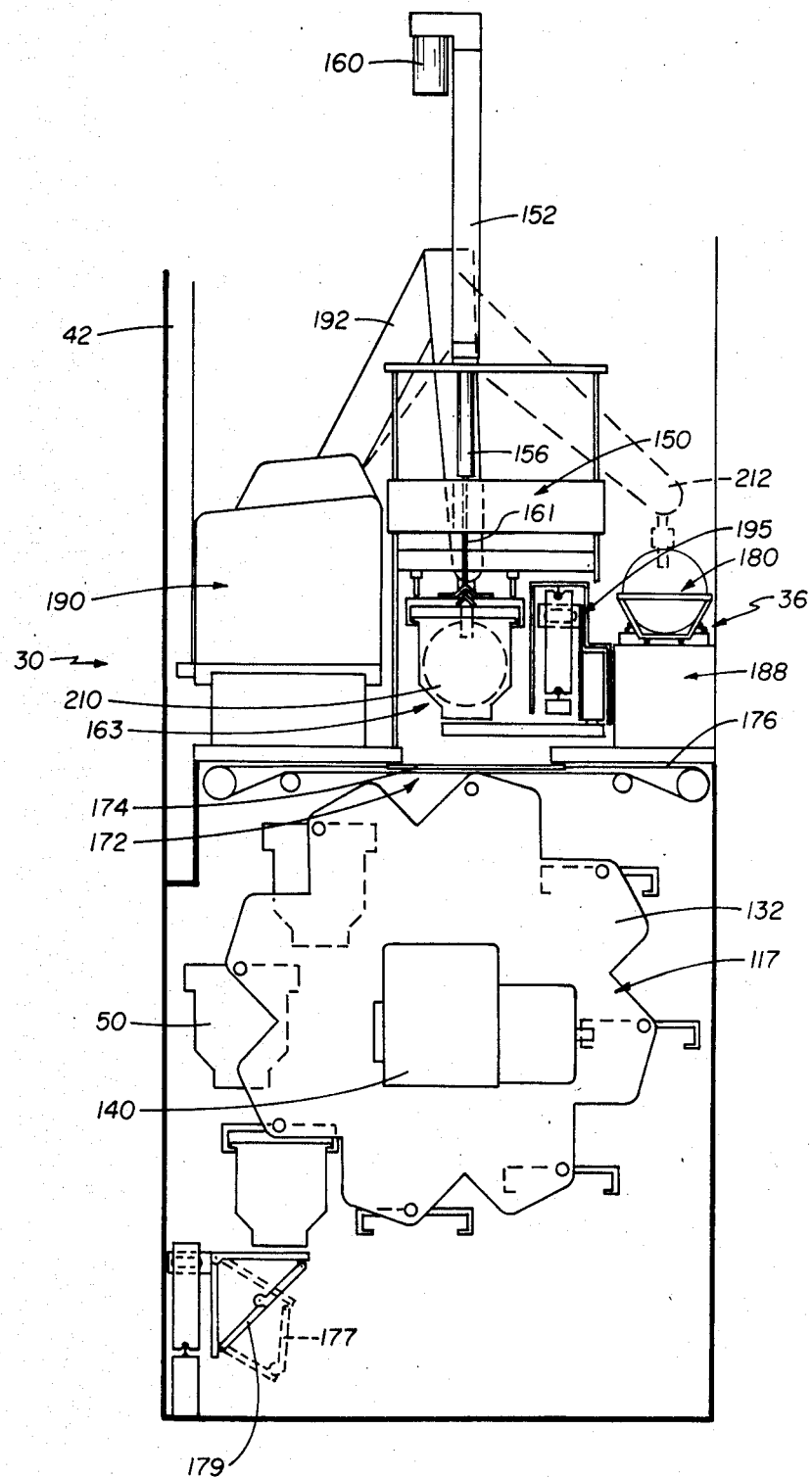
FIG. 8 is a sectional, partially pictorial, view illustrating the wafer handling station of the present invention.

Referring now to FIGS. 3, 6, and 7, the carrier pairs are severally walked into a selected one of a plurality of tube-load defining bracket members generally designated 118 carried by a ferris-wheel sub-assembly generally designated 119. The bracket members 118 are open-rectangular frames constituted by elongated side rails 120 and end rails 122. Flanges 124 are provided along the bottom of each of the rails 120 that define shelves for receiving and supporting the outwardly projecting flanges 126 carried by the plastic carriers 50 (also viewable in FIG. 4). Axially aligned angled-bearings 128 are provided on each of the end rails 122 of the several brackets 118, and the brackets 118 are severally hung on corresponding ones of axially-aligned and confronting shafts 130 projecting from vanes 132 radially formed on wheels 134 mounted for rotation with a shaft 136 operatively coupled to a motor 140 (FIG. 8). In the preferred embodiment, the vanes 132 have eight-pairs of the axially aligned posts 130, and eight tube-load defining brackets 118. As will be appreciated, the brackets 118 can then be loaded with eight (8) spacially separated arrays of carriers each defining a different tube-load in a correspondingly different storage location.

As best seen in FIG. 7, a lifting member generally designated 138 is fastened to each of the end rails 122 of the several brackets 118. The members 138 include spaced, substantially V-shaped portions 140, 142 the confronting walls of which define a first channel portion generally designated 144 therethrough that is of a comparatively small dimension in regions of the bracket 138 proximate the "V" thereof, and a second channel portion generally designated 146 of comparatively large dimension in regions thereof remote from the "V" of the rails 138.

Figure 9:
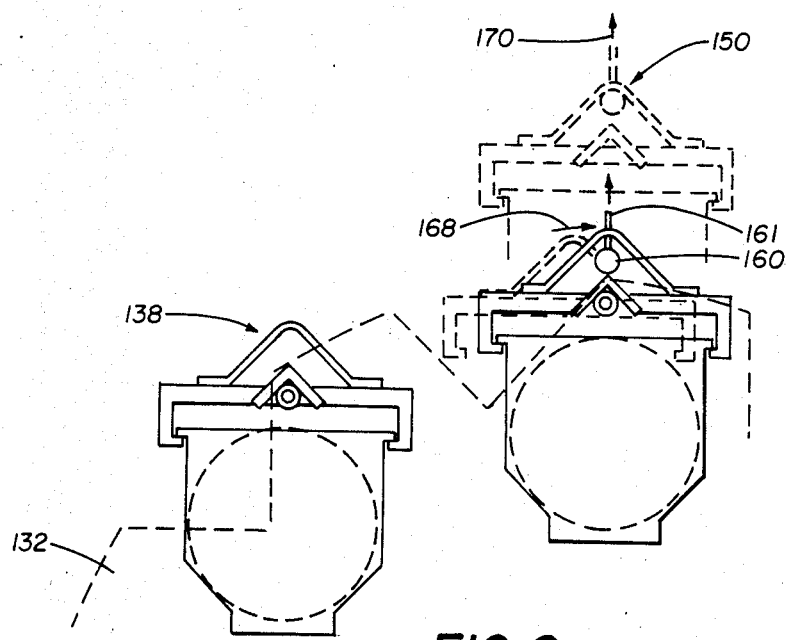
FIG. 9 is a partially schematic, sectional view useful in illustrating the operation of a vertical transfer subassembly of the wafer handling station of the present invention.

Referring now to FIGS. 3, 8 and 9, a vertical transfer sub-assembly generally designated 150 is provided superadjacent the ferriswheel sub-assembly 119 for lifting and lowering any selected tube-load of carriers. The vertical transfer sub-assembly 150 preferably includes first and second vertically-oriented ball screw assemblies 152, 154 having axially movable rams 156, 158. Motors 160, 162 are provided for raising and lowering the associated rams 156, 158 by suitable actuation of the ball screws 152, 154.

As best seen in FIG. 9, each of the rams 156, 158 is provided with a ball member 160 on its free end that is connected via a resilient shaft 161 to the corresponding one of the ball screw assemblies 152, 154. The actuators 160, 162 are operable to lower the rams 156, 158 to that vertical position that intersects the locus traced by the vanes 132, during their rotation by the shaft 136. While in their lowered position, the shaft 136 is then controllably rotated, and the vanes 132 rotate therewith in the direction of an arrow 168. The upstanding lifting rails 138 thereof (FIG. 7) therewith trace a circular locus. The resilient member 161 of the rams 156, 158 is received through the slot 144, and the enlarged ball 160 carried on the free end of the arms 156, 158 is received through the slot 146 thereof. The actuators 160, 162 then move the ball screws 152, 154 upwardly in such a way that the balls 160 abut the "V" portion of the lifting rails 138 of the associated brackets 118. With continued upward translation of the rams 156, 158, the angle members 128 of the selected carrier-loaded bracket 118 are lifted off the posts 130 as illustrated by an arrow 170 (FIG. 9), and therewith the selected tube-load of carriers are moved to an upper transfer position generally designated at 163 and illustrated in FIGS. 3 and 8.

A door sub-assembly generally designated 172 in FIG. 8 is provided between the vertical transfer sub-assembly 150 and the ferriswheel sub-assembly 119 to preserve an intended clean condition in the ferriswheel sub-assembly. The door sub-assembly 172 includes a closure member 174 that is slidably moved by a continuous belt 176 between its illustrated closed condition and an open position, not illustrated, that allows the rams 156, 158 to be received into the ferriswheel sub-assembly. The walking beam carrier receiving platform 70 of the input walking beam sub-assembly 68 is selectably positionable between its operative position illustrated in solid line, and a collasped position illustrated in dashed outline 177 (FIG. 8), that allows unimpeded rotation of the vanes 132.

Figure 10:
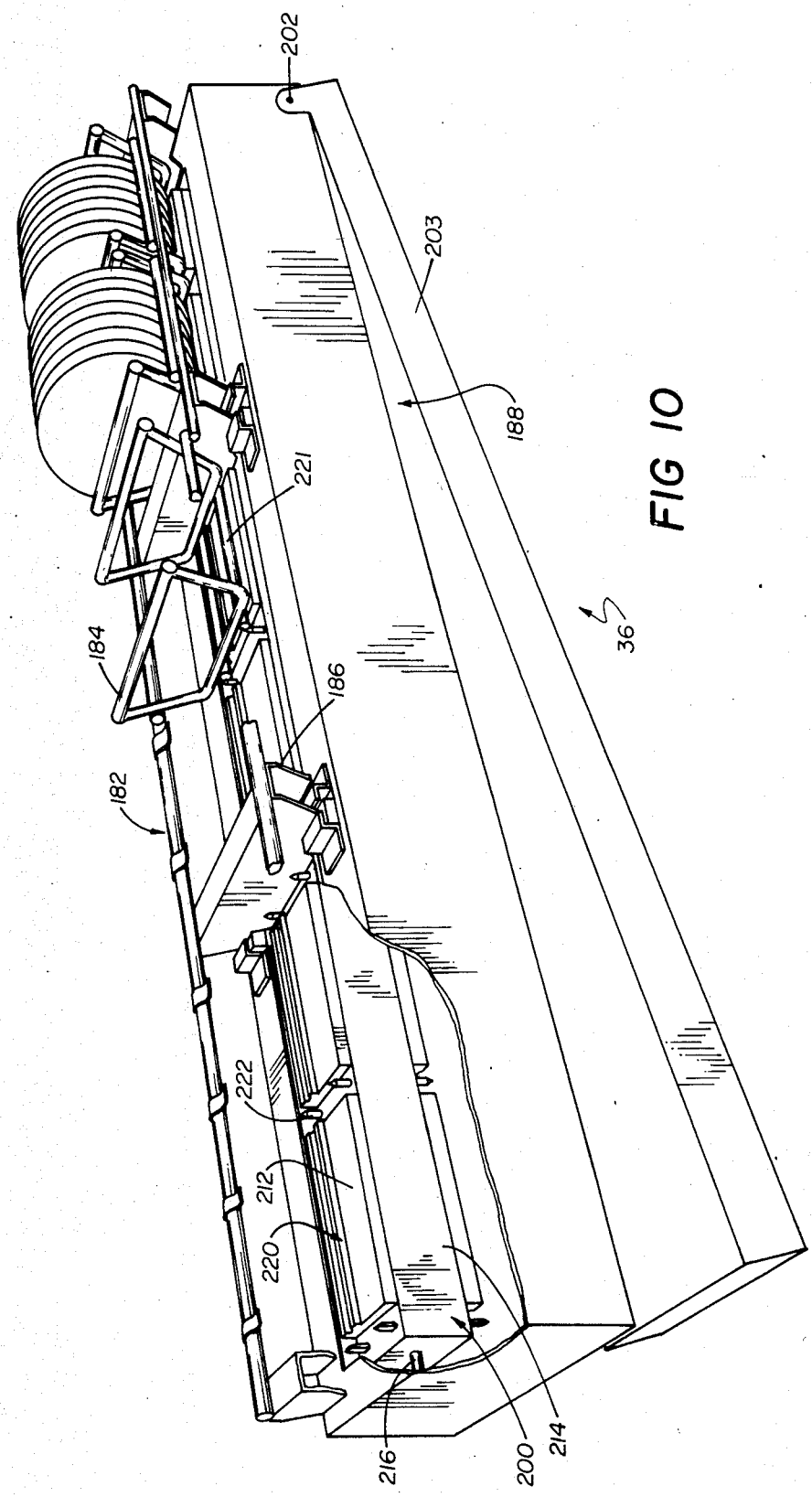
FIG. 10 is a perspective view illustrating an inclinable transfer pad sub-assembly defining an elevator-transport access port of the wafer handling station of the present invention.

Referring now to FIGS. 8 and 10, quartzware generally designated at 180 is provided at the elevator-transport access port 36 by the elevator 40 (FIG. 1). In the illustrated embodiment, the quartzware 180 includes an intermediate carrier generally designated 182, and plural four-rail boats 184 resting in the carrier 182. U-shaped members 186 are provided along the bottom of the intermediate carrier 182, preferably four, for receiving a corresponding one of the four tines of the elevator 40 (FIG. 1). Although in the preferred embodiment a boat-loaded intermediate carrier is employed, it is possible to use other quartzware configurations for receiving a tube-load of wafers without departing from the inventive concept, such as the quartzware disclosed and claimed in copending United States Utility patent application Ser. No. 784,347, entitled APPARATUS AND METHOD FOR BOATS-ONLY LOADING, of the same inventive entity and assignee as herein.

The intermediate carrier 182 is supported by an inclined transfer pad sub-assembly generally designated 188 to be described, and a horizontal transfer sub-assembly generally designated at 190 is mounted to the wafer loading station 30 for moving the wafers in the plastic carriers into the quartzware for processing and for moving the processed wafers from the intermediate carrier back to their associated plastic carriers after processing. In the preferred embodiment, the horizontal transfer sub-assembly includes a robot having an arm 192, such as the precision robot and arm assembly commercially available from Precision Robots, Inc., although other suitable transfer mechanisms, such as commercially available wafer mass transfer robots, can be employed as well without departing from the inventive concept. The robot arm 192 has six degrees of movement freedom in the preferred embodiment, and is operable in well-known manner under PROM control to serially transfer individual ones of the wafers between the quartzware and the associated carriers. The robot arm is selectably operative to accommodate different wafer spacings in the carriers and quartzware, and is selectably operative to place the wafers in any intended spaced-apart relation and spacial orientation including a back-to-back orientation useful in many coating processes. As schematically illustrated by dashed boxes 194, 196, the robot arm 192 is operable to exchange its pick-up hands to always use only one hand for wafers to be processed and to use a different dedicated hand for wafers after processing. In this way, cross-contamination and particulate transfer between outgoing and return wafers that would otherwise result if the same pick-up hands were employed is substantially eliminated.

Figure 11:
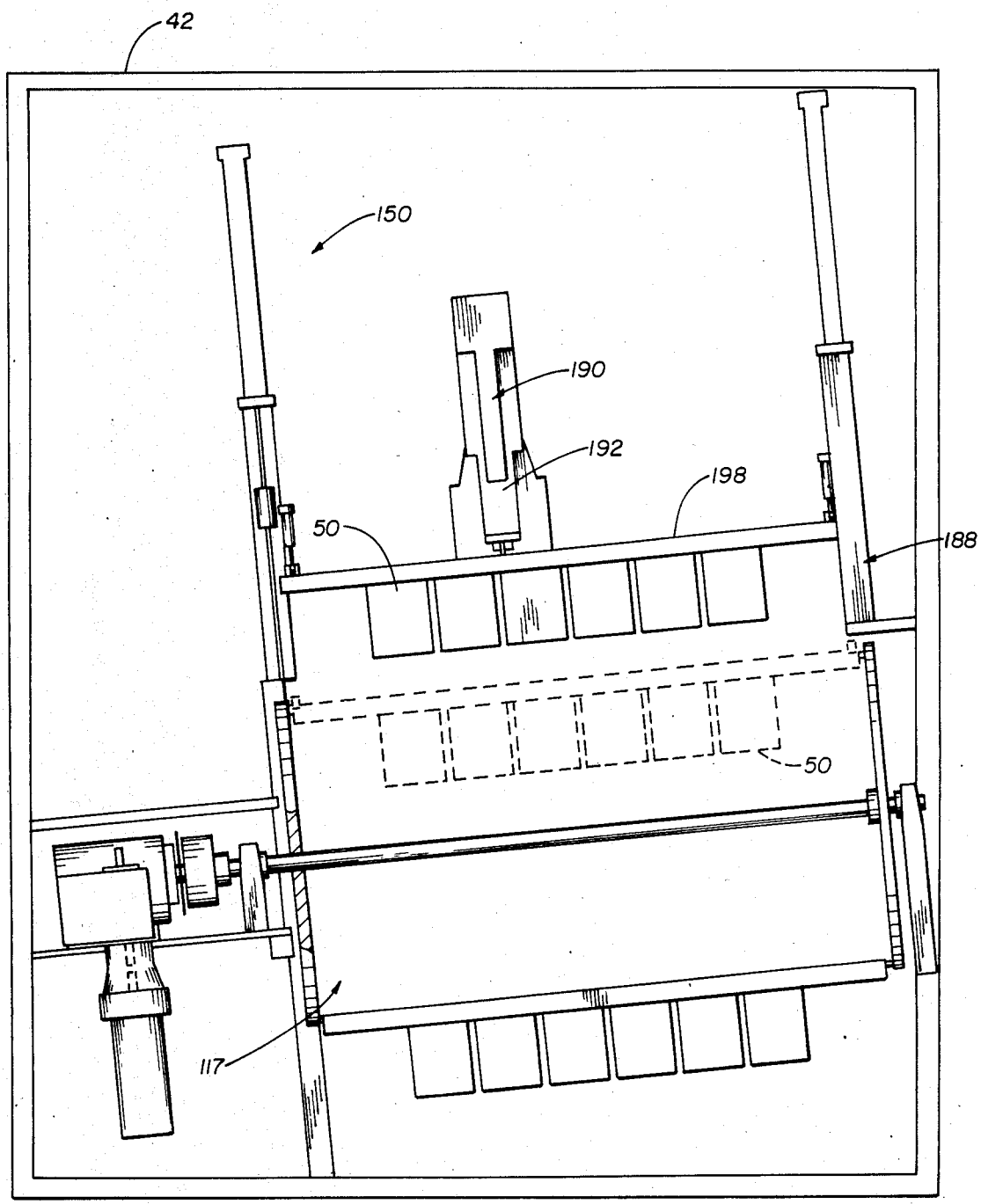
FIG. 11 is an elevational view, partially sectional, and partially pictorial, of the wafer handling station of the present invention.

Briefly referring to FIGS. 8 and 11, the ferriswheel sub-assembly 117, the vertical transfer sub-assembly 150, the inclined transfer pad sub-assembly 188, the robot 190 and its arm 192, and an output horizontal translation sub-assembly generally designated 195 to be described are mounted in the housing 42 of the wafer handling station 30 at an acute angle to the horizontal. The several wafers slidably received in the several carriers 50 and in the quartzware 182 (FIGS. 2 and 10) are thereby urged by the component of the gravitational field that acts in the direction of inclination to bias the several wafers against their confronting supports in a known, and precisely controlled spacial position. In this manner, any orientation uncertainty in the position of the wafers that would otherwise arise due to the play of the wafers in the carriers and in the quartzware slots provided therefor is substantially eliminated.

Figure 12:
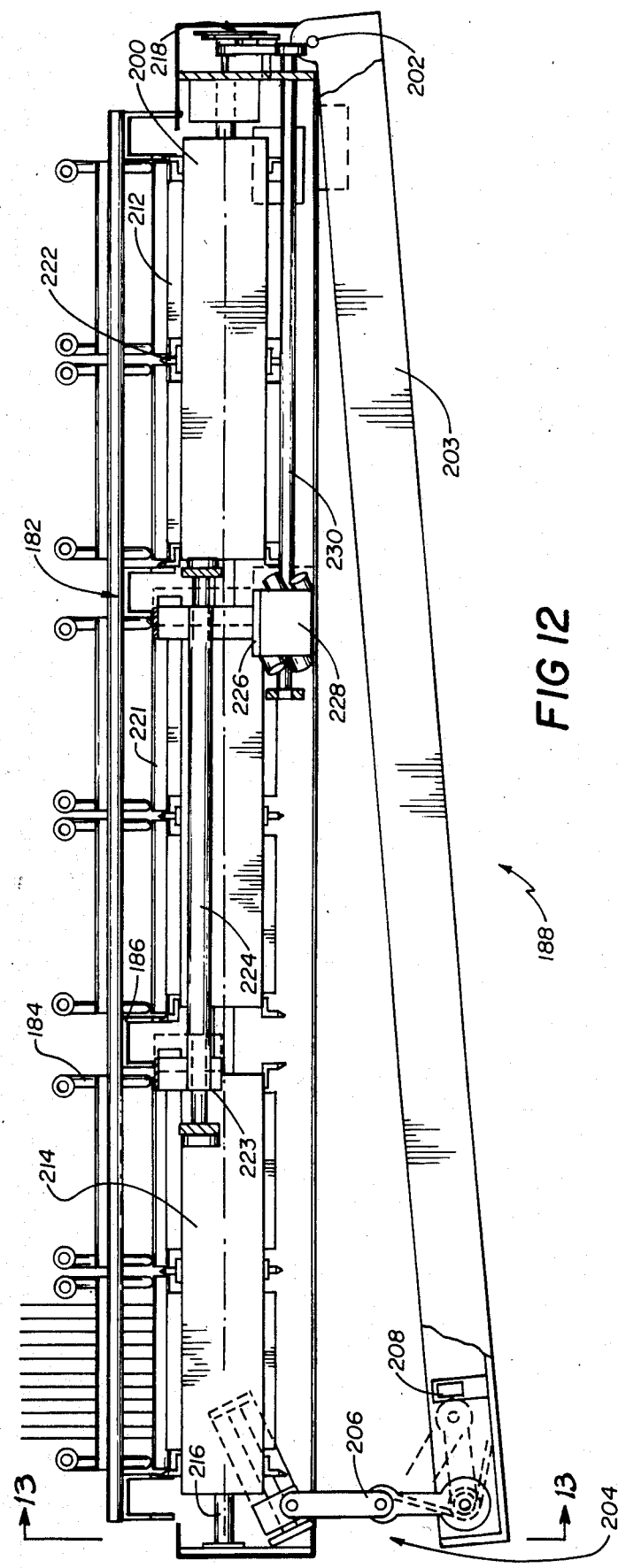
FIG. 12 is a partially pictorial, side elevational view of the elevator-transport access port of the wafer handling station according to the present invention.
Figure 13:
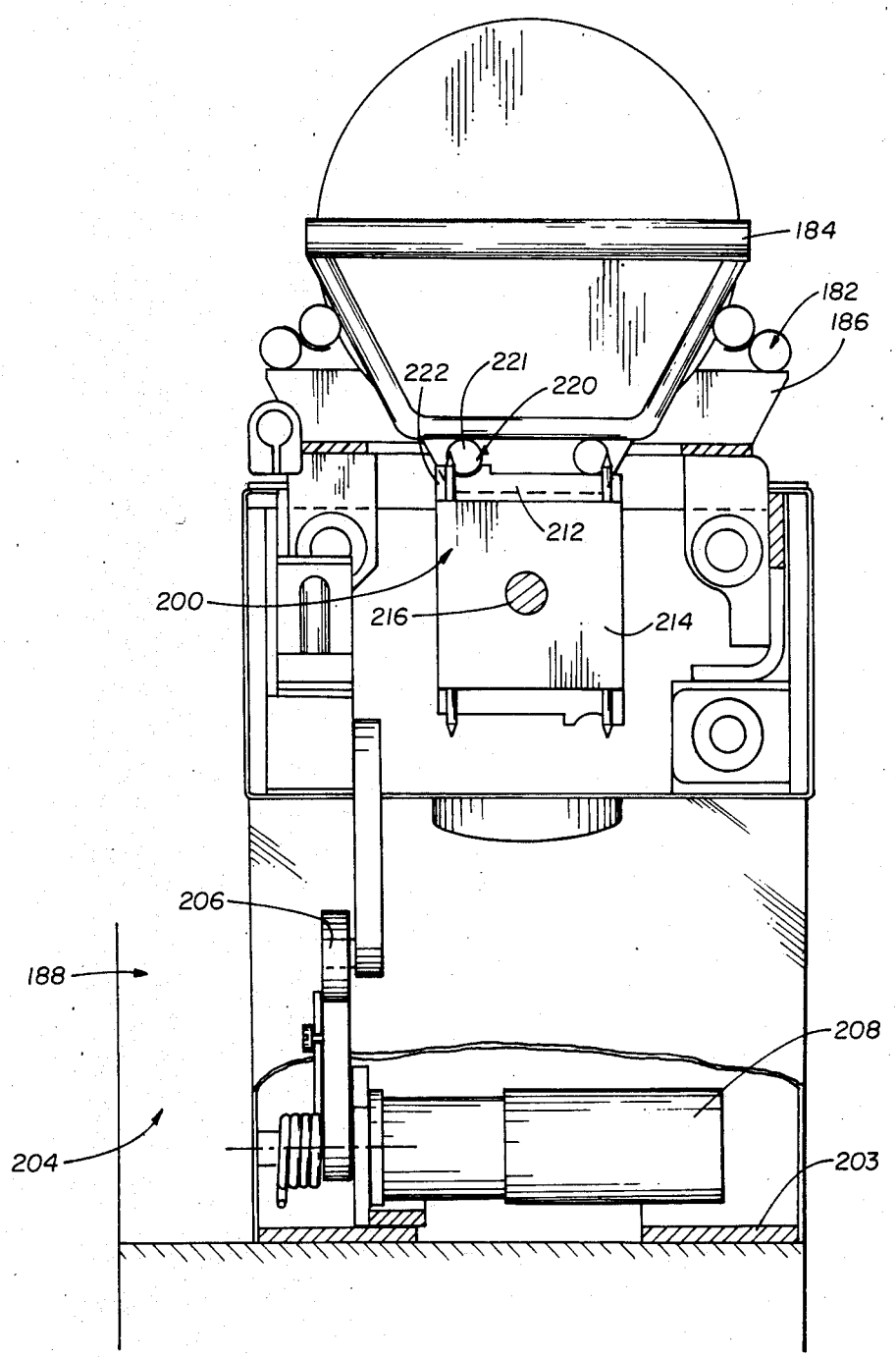
FIG. 13 is an end, partially pictorial, elevational view of the elevator-transport access port of the wafer handling station according to the present invention.

Referring now to FIGS. 10, 12, and 13, the transfer pad sub-assembly 188 includes a quartzware receiving platform generally designated 200 that is hinged at a pivot 202 for rotary motion relative to a fixed support member 203 that is fastened to the housing of the wafer handling station at the same acute angle to the horizontal as described above in connection with the description of FIG. 11. A lift mechanism generally designated 204 is provided between the ends of the members 200, 203 remote from the hinge 202. The lift mechanism 204 includes an articulated arm 206 operatively coupled to a lift actuator 208. The quartzware receiving platform 200 is thereby controllably rotated between a load position, where it is inclined at the same acute angle to the horizontal, and an elevator interface position, where it is generally horizontal. In its inclined condition, the robot arm 192 (FIG. 8) is thereby enabled to controllably move to the biased locations of the wafers out of and into the quartzware for transfer out of and back to the carriers as illustrated in dashed outlines 210, 212 in FIG. 8. Whenever the transfer pad sub-assembly 188 is in its horizontal condition, the elevator 40 (FIG. 1) is therewith enabled to move its tines into the U-shaped members 186 carried by the intermediate carrier 182.

Cross-contamination between outgoing and incoming tube-loads of wafers is eliminated by the provision of separate surfaces in the transfer pad sub-assembly 188 upon which incoming and outgoing quartzware is supported. In the illustrated embodiment, the boats 184 received in the intermediate carrier 182 are supported by pads 212, preferably of quartz, that are fastened to opposed planar surfaces of an inset 214 that is mounted for rotation with a shaft 216 coupled to an actuator generally designated at 218. The pads 212 have longitudinally extending grooves generally designated 220 formed therein that extend along the direction of elongation of the rotatable inset 214 for providing lateral alignment of the bottom rails 221 of the four-rail boats 184 carried by the intermediate carrier 182. Upstanding posts 222, suitably spaced along the opposed surfaces of the rotatable insert 212, have beveled surfaces at their free ends that cooperate with the confronting surfaces of the quartz boats carried by the intermediate carrier 182 for providing longitudinal alignment thereof. It will be appreciated that the provision of separate opposed surfaces on the rotatable inset 214 for outgoing and incoming tube-loads of product wholly eliminates surface contact induced cross-contamination between outgoing and incoming product, and thus helps maintain the desired clean conditions for automated wafer handling. It will further be appreciated that the rotatable inset has four sides defined at right-angles to each other that can each be severally employed to prevent cross-contamination between a plurality of different processing steps using the several surfaces thereof.

The pads 212 are in spaced apart relation along the direction of elongation of the rotatable inset 214. In the innerspaces therebetween, the U-shaped members 186 of the intermediate carrier are received. Axially movable abutments 223 are provided subjacent the two inner U-shaped members 186 for supporting the intermediate carrier 182 on the quartzware receiving platform 200 of the transfer pad sub-assembly 188. The axially movable members 223 are fastened together by an elongated tie 224, and the assembly is mounted as at 226 for linear motion via a rotary motion to linear translation convertor 228, preferably a ROHLIX drive assembly, slidably mounted on a shaft 230 of the actuator 218. The ROHLIX drive 228 translates in response to rotary motion of the shaft 230, and therewith moves different portions of the abutments 223 into supporting relation with the confronting wall of the U-shaped members 186. As will be appreciated, the different axial positions of the abutments 223 as illustrated in solid and dashed outlines thereby further prevents cross-contamination between the outgoing and incoming product.

During transfer between the several carriers and the quartzware, the transfer pad sub-assembly of the elevator-transport access port is in its inclined condition. The robot arm thereby is enabled to precisely transfer wafers from the carriers to the quartzware for providing a tube-load to be processed, and to transfer the wafers individually back to their original carriers in the same order after processing. During processing of each particular tube-load of product, the then empty carriers are stored in their corresponding storage location of the ferriswheel sub-assembly. In the illustrated embodiment, it will be appreciated that up to two (2) tube-loads of product to be coated and up to six (6) tube-loads of empty carriers are readily accommodated in the ferriswheel sub-assembly.

As shown in FIGS. 3 and 8, the output horizontal translation sub-assembly 195 is provided intermediate the vertical transfer station 150 and the inclined pad sub-assembly 188 for controllably moving processed wafers loaded back into their original carriers by the robot into the output elevator queue. In the preferred embodiment, the output translation sub-assembly 195 is constituted as an output walking beam substantially identical to the input walking beam provided for controllably moving the carriers having wafers to be processed into the ferriswheel sub-assembly described above in connection with the description of FIGS. 3, 5, and 6. For the output walking beam sub-assembly 195, the carrier receiving platform is connected to an actuator and linkage shown dashed generally at 232 in FIG. 5 that is operative to pivot the fingers of the platform 70 between an extended operative position shown in solid line and an inner retracted position partially shown dashed at 234. In the outer position, the platform cycles between the lift, X translation, lowering, and reverse X translation movements described above in connection with the description of the operation of the input walking beam for controllably moving carrier pairs two at a time over to the output elevator, which stores the product in the output queue until an operator removes the carriers through the output port 34. In the retracted position 234 of the walking finger platform 70 of the output walking beam, the platform is free from the path of motion of the vertical transfer sub-assembly so that the individual tube-loads of product are able to be transported between their corresponding ferriswheel locations and the vertical transfer position. The output walking beam preferably is in two, separately drivable parts, as shown generally at 235 in FIG. 3, that allows the separate walking-out of an outboard carrier to the output port 34 to allow an analysis thereof from which further process steps on that particular tube-load can be carried out in dependance on the test results.

Figure 14:
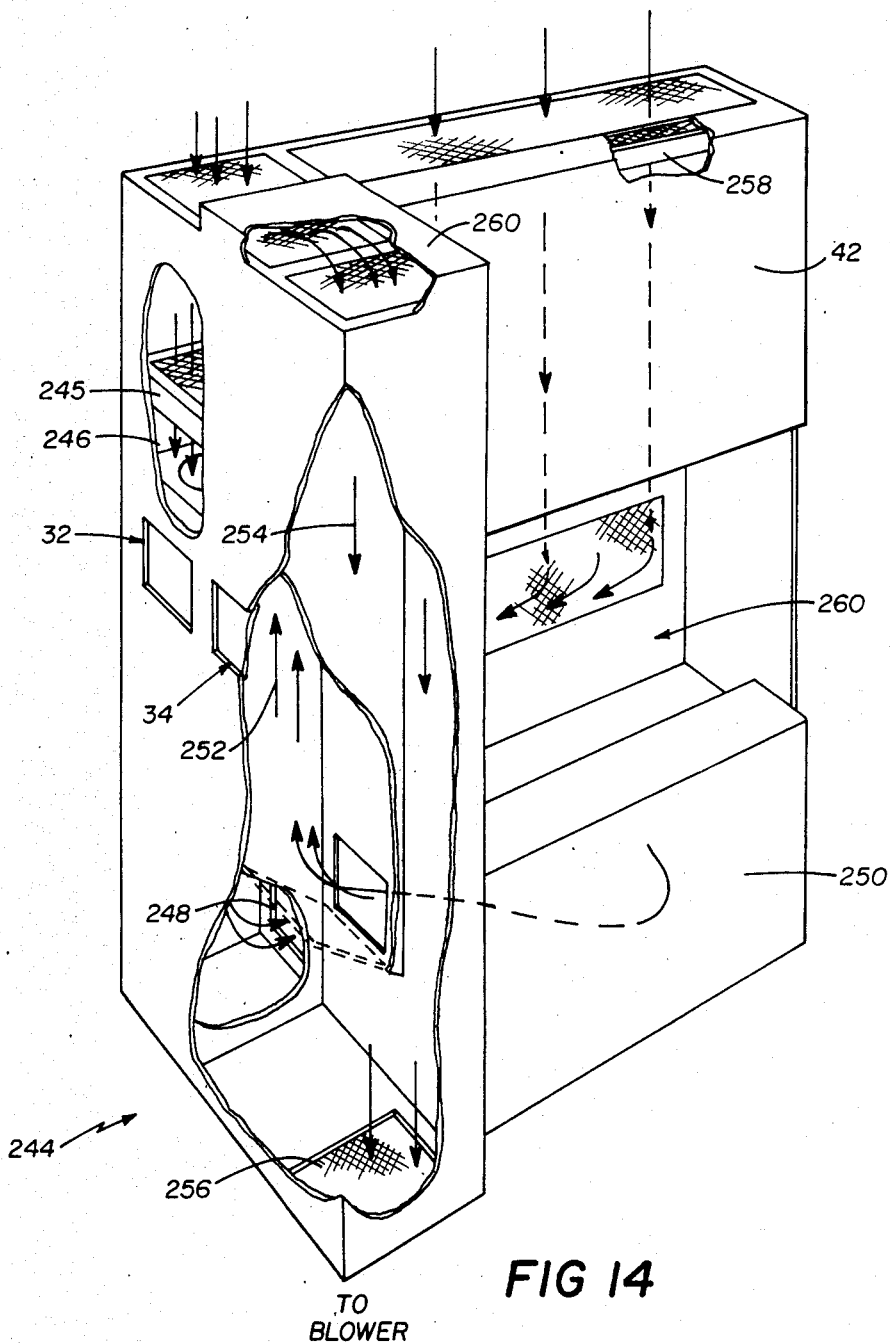
FIG. 14 is a broken-away perspective view illustrating an air-flow system of the wafer handling station of the present invention.

Referring now to FIG. 14, generally designated at 244 is a pictorial view illustrating a presently preferred air-flow pattern that helps maintain an intended clean condition in the cooperating sub-assemblies of the wafer handling station according to the present invention. An internal air blower is coupled through a conduit containing a HEPA filter 245 that directs clean air through the input queue 246 and downwardly through the input walking beam region 248 into the ferriswheel sub-assembly chamber 250. The air circulates therein and is directed out through a conduit into the output elevator queue 252. A positive pressure is thus maintained in the input queue, the output queue, and in the ferriswheel sub-assembly that prevents external air-borne contaminants from migrating thereinto. A blower is coupled to a conduit in a drive electronics chamber 254 which draws the air therethrough and exhausts it through the floor as shown at 256. A negative pressure is therein created which helps draw particulates from the robot area, the mechanism areas, and the elevator-transport access port area which thereby helps control the airborne contamination problem in these regions. An internal blower is coupled through a conduit containing a HEPA filter 258 that directs air through the robot area 190 and into the electronics chamber 254 through a manifold provided therefor. This air circulates through the output queue and is coupled back through the floor exhaust 256 through a bonnet schematically illustrated 260 provided at the top of the handler. It should be noted that the air can be directly vented through the ceiling by providing a top exhaust, not shown, rather than the bonnet 260.

In summary, the wafer handling station of the instant invention accepts plural carriers input in the input port and holds them in a plural tube-load input queue. The carriers are transferred in pairs into different tube-loads of product and temporarily stored by the ferriswheel sub-assembly. This sub-assembly maintains in the preferred embodiment two tube-loads of product to be processed and six tube-loads of product carrier during processing. A robot and cooperative vertical transfer sub-assembly are operative to load the carriers into quartzware for a designated furnace processing tube and remove the wafers after processing back to their original carriers and in the same positional order. The output walking beam walks the carriers having processed wafers out into the output queue in two modes. In a test mode, only one carrier need be removed to determine already achieved processing quality so that subsequent processing decisions can be made. In another mode, and usually for single step coating processes, the output beam walks the carriers having processed product into the output queue, which can maintain therein up to two tube-loads of processed product until removal by the operator. It may be noted that the entire system can be fully automated, without requiring an operator to insert and remove carriers, as, for example, can readily be accomplished by providing automatic transport means in communication with the input and output ports for severally adding and removing product thereinto before and after processing.

Many modifications of the presently disclosed invention will become apparent to those skilled in the art without departing from the scope of the instant invention.

I claim:

1. A wafer handling station for an automated furnace system having an elevator transport mechanism, comprising:
   carrier input means for receiving wafer-loaded carriers for processing;
   carrier output means for delivering wafer-loaded carriers after processing;
   quartzware receiving means for providing an elevator-transport access port;
   input storing means coupled to the carrier input means for storing plural carriers input into the carrier input means in a multiple tube-load input queue;
   arraying and intermediate storage means coupled to the input means for arraying the carriers input in the input queue into plural spacially separated arrays of carriers each constituting a different tube-load of wafers in a correspondingly different storage location; and
   transfer means coupled between the carrier input means, the carrier output means, and the quartzware receiving means for transferring a tube-load of wafers loaded in the wafer-loaded carriers from any selected different storage location to the quartzware receiving station for processing, to transfer the said wafers from the quartzware receiving station back to their particular carriers after processing, and for transferring the said wafers of any tube-load of wafers to the output queue.

2. The system of claim 1, wherein said carrier input means includes an input port.

3. The system of claim 2, wherein said carrier output means includes an output port.

4. The system of claim 3, wherein said quartzware receiving means includes a transfer pad.

5. The system of claim 4, wherein said arraying and intermediate storage means includes a ferriswheel having radially spaced vanes cooperative to define corresponding ones of said different storage locations therebetween.

6. The system of claim 5, wherein said transfer pad and said ferriswheel storage locations are oriented at the same preselected non-zero acute angle to the horizontal.

7. The system of claim 1, wherein said arraying and intermediate storage means includes a ferrishweel having spaced, commonly rotatable vanes defining said different storage locations therebetween, and wherein said transfer means includes a vertical transfer sub-assembly superjacent said ferrishweel for lifting said arrays of carriers each defining a different tube-load, and a horizontal transfer subassembly for transferring the wafers in said carriers of said tube-loads of carriers to the quartzware receiving means.

8. The system of claim 7, wherein said horizontal transfer means includes a robot.

9. The system of claim 8, further including means for translating said carriers from said input queue to said storage locations of said ferriswheel.

10. The system of claim 8, further including means for translating said carriers from said vertical translation sub-assembly to said output queue.

11. The system of claim 9, wherein said carriers to storage location translation means includes an input walking beam.

12. The system of claim 10, wherein said vertical translation sub-assembly to output queue translation means includes an output walking beam.

13. The system of claim 1, further including means for preventing cross-contamination between outgoing and incoming product.

14. A wafer handling station for an automated furnace having an elevator, comprising;
  a carrier receiving input port;
  a carrier delivering output port;
  an elevator-transport access port;
  means for arraying plural wafer-loaded carriers so as to define a tube-load of wafers to be processed;
  means for moving said tube-laod of wafers to the elevator-transport acess port for processing;
  means for transferring the tube-load of wafers from the elevator-transport access port to the carrier delivering output port after processing; and
  means coupled to the elevator-transport access port for providing different, and dedicated surfaces upon which the tube-load of wafers to be processed and said tube-load of wafers after processing are supported to prevent the possibility of contact-induced cross-contamination.

15. The invention of claim 14, further including means coupled between the carrier receiving input port and the arraying means for providing an input storage queu capable of holding plural carriers representing multiple tube-loads of wafers to be processed.

16. The invention of claim 14, further including means coupled between said arraying means and said carrier delivery output port for providing an output storage queue capable of holding plural carriers representing multiple tube-loads of wafers.

17. The invention of claim 14, wherein said arraying means includes means for arraying plural carriers into multiple arrays of wafers to be processed and for simultaneously storing said multiple arrays in different, identifiable spacial locations.

18. The invention of claim 14, further including means coupled to said input port, said output port, said transferring means, said moving means, and said arraying means for reducing air-borne particulates.

19. The invention of claim 18, wherein said air-borne particulates reducing means includes means for providing a positive air-flow.

20. The invention of claim 18, wherein said air-borne particulate reducing means includes means for providing a negative pressure air-flow.

21. A wafer handling station for an automated furnace system having an elevator transport mechanism, comprising:
  carrier input means for receiving wafer-loaded carriers for processing;
  carrier output means for delivering wafer-loaded carriers after processing;
  quartzware receiving means for providing an elevator-transport access port;
  arraying means coupled to the input means for arraying the carriers input thereinto as an array representing a tube-load of wafers; and
  transfer means coupled between the carrier input means, the carrier output means, and the quartzware receiving means for transferring a tube-load of wafers to the quartzware receiving station for processing, to transfer the said wafers from the quartzware receiving station back to their particular carriers after processing, and for transferring the said wafers of a tube-load of wafers to the output means.

* * * * *

UNITED STATES PATENT AND TRADEMARK OFFICE
CERTIFICATE OF CORRECTION

PATENT NO. : 4,701,096

DATED : October 20, 1987

INVENTOR(S) : Daniel J. Fisher, Jr.

It is certified that error appears in the above-identified patent and that said Letters Patent is hereby corrected as shown below: Title page:

BEFORE THE ABSTRACT

Insert  --Attorney, Agent, or Firm - Weingarten, Schurgin, Gagnebin & Hayes--

IN THE ABSTRACT

2nd line, "and output port," should read --an output port,--
    3rd line, "queue each" should read --queues each--
    8th line, "waling beam" should read --walking beam--
    14th line, "carries" should read --carriers--

Column 1, line 33, "throughout" should read --throughput--

Column 2, lines 6-7, "intermi- ate" should read --intermedi- ate--
    line 26, "dislcosed" should read --disclosed--

Column 3, line 47, "inthe" should read --in the--

Column 4, line 8, "receving" should read --receiving--

Column 5, line 17, "and elevator" should read --an elevator--

Column 6, line 32, "A X" should read --An X--
    line 33, "a X" should read --an X--

Column 8, line 9, "conditionand" should read --condition and--
    line 15, "collasped" should read --collapsed--

UNITED STATES PATENT AND TRADEMARK OFFICE
CERTIFICATE OF CORRECTION

PATENT NO. : 4,701,096  Page 2 of 2

DATED : October 20, 1987

INVENTOR(S) : Daniel J. Fisher, Jr.

It is certified that error appears in the above-identified patent and that said Letters Patent is hereby corrected as shown below:

Column 11, line 12, "dependance" should read --dependence--

Column 12, line 59, "ferrisweel" should read --ferriswheel--

Column 13, line 21, "tube-laod" should read --tube-load-- line 22, "acess port" should read --access port-- line 35, "queu" should read --queue--

Signed and Sealed this

Twentieth Day of December, 1988

Attest:

DONALD J. QUIGG

Attesting Officer    Commissioner of Patents and Trademarks